(12) United States Patent
Lashkari

(10) Patent No.: US 7,873,172 B2
(45) Date of Patent: Jan. 18, 2011

(54) MODIFIED VOLTERRA-WIENER-HAMMERSTEIN (MVWH) METHOD FOR LOUDSPEAKER MODELING AND EQUALIZATION

(75) Inventor: Khosrow Lashkari, Hayward, CA (US)

(73) Assignee: NTT DoCoMo, Inc., Tokyo (JP)

( * ) Notice: Subject to any disclaimer, the term of this patent is extended or adjusted under 35 U.S.C. 154(b) by 1224 days.

(21) Appl. No.: 11/446,085

(22) Filed: May 31, 2006

(65) Prior Publication Data

US 2006/0274904 A1 Dec. 7, 2006

Related U.S. Application Data

(60) Provisional application No. 60/688,179, filed on Jun. 6, 2005.

(51) Int. Cl.
*H04R 29/00* (2006.01)
(52) U.S. Cl. .............................. 381/59; 381/98; 700/94
(58) Field of Classification Search ............ 381/21–23, 381/119, 59, 97, 98, 58; 369/4; 700/94; 704/501, 504
See application file for complete search history.

(56) References Cited

U.S. PATENT DOCUMENTS

| 4,074,070 A | 2/1978 | Gaus |
| 5,068,903 A | 11/1991 | Walker |
| 5,542,001 A | 7/1996 | Reiffin |
| 6,408,079 B1 | 6/2002 | Katayama et al. |

FOREIGN PATENT DOCUMENTS

WO    WO 96/26624 A1    8/1996

OTHER PUBLICATIONS

Hyun Woo Kang, Yong Soo Cho, and Dae Hee Youn, Adaptive Precompensaton of Wiener System, IEEE Transaction on Signal Processing, vol. 46, No. 10, Oct. 1998.*

Yoshinobu Kahikawa and Yasu Nomura, Design of Nonlinear Inverse Systmes by Means of Adaptive Volterra Filters, Electronics and Communications in Japan, Part 3, vol. 80, No. 8, 1997.*

Josef Voros, An Iterative Method for Hammerstein-Wiener Systmems Parameter Identification, Journal of Electrical Enginering, vol. 55, No. 11-12, 2004, pp. 328-331.*

PCT International Preliminary Report on Patentability, PCT/US/2006/021502 mailed Dec. 21, 2007 (1 page).

PCT Written Opinion of the International Searching Authority, PCT/US/2006/021502 mailed Dec. 21, 2007 (5 pages).

Lashkari K., "High quality sound from small loudspeakers using the exact inverse," Signals, Systems, and Computers, 2004 (Nov. 7, 2004), pp. 430-434, XP010780303.

(Continued)

*Primary Examiner*—Vivian Chin
*Assistant Examiner*—Friedrich Fahnert
(74) *Attorney, Agent, or Firm*—Blakely, Sokoloff, Taylor & Zafman LLP

(57) ABSTRACT

A method and apparatus for adaptive precompensation is disclosed. In one embodiment, the method comprises modifying operation of a predistortion filter in response to previous predistorted values and an original input signal, determining a precompensation error between the original input samples and the predicted loudspeaker output, and substantially reducing the precompensation error by using the exact inverse of a loudspeaker model that is a cascaded arrangement of at least one linear system with a non-linear system.

31 Claims, 9 Drawing Sheets

OTHER PUBLICATIONS

Hyun Woo Kang et al., "Adaptive Precompensation of Wiener Systems," Oct. 1998, pp. 2825-2829, XP011058302.

Nomura Y et al., "Linearization of Loudspeaker Systems using MINT and Volterra Filters," (Mar. 18, 2005), pp. 457-460, XP010792581.

Kajikawa Y et al., "Design of Nonlinear Inverse Systems by Means of Adaptive Volterra Filters," (Aug. 1, 1997), pp. 36-45, XP00736572.

Frank, W., Reger, R., and Appel, U.: "Loudspeaker Nonlinearities-Anaysis and Compensation," Conf. Record 26th, Asilomar Conference on Signals, Systems and Computers, Pacific Grove, CA 756-760, Oct. 1992.

Matthews, V.J.: "Adaptive Polynomial Filters," IEEE SP magazine, vol. 8, No. 3 pp. 10-26, Jul. 1991.

Kajikawa, Y., Nomura, Y.: "A Design for Nonlinear Inverse System by the Adaptive Volterra Filter," IEICE Trans.v, vol. J79-A, No. 11, pp. 1808-1816, Nov. 1996. *Japanese and English Translation.

PCT International Search Report for PCT Appln No. US2006/021502, mailed Sep. 12, 2006 (3 pages).

PCT Written Opinion for PCT Appln No. US2006/021502, mailed Sep. 12, 2006 (5 pages).

Lashkari, K.: "High quality sound from small loudspeakers using the exact inverse," Signals, Systems and Computers, 2004. Conference Record of the Thirty-Eigth Asilomar Conference on Pacific Grove, CA USA Nov. 7-10, 2004, Piscataway, NJ, USA, IEEE, Nov. 7, 2004, pp. 430-434, XP010780303, ISBN: 0-7803-8622-1.

Hyun Woo Kang, et al.: "Adaptive Precompensation of Wiener Systems," IEEE Transactions on Signal Processing, IEEE Service Center, New Yor, NY, US, vol. 46, No. 10, Oct. 1998, pp. 2825-2829, XP011058302, ISBN: 1053-587X.

Nomura, Y. et al.: "Linearization of Loudspeaker Systems Using MINT and Volterra Filters," Acoustics, Speech, and Signal Processing, 2005. (ICASSP '05). IEEE International Conference on Philadelphia Pennsylvania, USA Mar. 18-23, 2005, Piscataway, NJ, USA, IEEE, Mar. 18, 2005, pp. 457-460, XP010792581, ISBN: 0-7803-8874-7.

Kajikawa, Y. et al.: "Design of Nonlinear Inverse Systems by Means of Adaptive Volterra Filters," Electronics & Communications in Japan Part III—Fundamental Electronic Science, Wiley, Hoboken, NJ, US, vol. 80, No. 8, Aug. 1, 1997, pp. 36-45, XP000736572, ISSN: 1042-0967.

* cited by examiner

MODIFIED VOLTERRA-WIENER-HAMMERSTEIN (MVWH) METHOD FOR LOUDSPEAKER MODELING AND EQUALIZATION

PRIORITY

The present patent application claims priority to and incorporates by reference the corresponding provisional patent application Ser. No. 60/688,179, entitled "Modified Volterra-Wiener-Hammerstein (MVWH) Method for Loudspeaker Modeling and Equalization," filed on Jun. 6, 2005.

FIELD OF THE INVENTION

The present invention relates to the field of loudspeaker distortion; more particularly, the present invention relates to loudspeaker modeling and equalization, or precompensation, to overcome a loudspeaker's distortion.

BACKGROUND OF THE INVENTION

Codec technology has advanced to the point that analog input and output (I/O) processing in mobile devices determine the limitations in audio and speech quality. Specifically, small loudspeakers with nonlinear characteristics are a major source of audio degradation in terminal devices such as cellular phones, personal digital assistants (PDAs) and laptop computers.

Loudspeakers have two types of distortions: linear distortions (low and high frequency attenuation, resonances, etc.) and nonlinear distortions. The amplitudes and phases of the loudspeaker's frequency response characterize the linear distortion. The effect of linear distortion is to alter the amplitudes and phases of the signal's frequency content. Linear distortion does not add any extra frequencies to the sound and can be compensated using a linear filter with a frequency response that is the inverse of the loudspeaker's linear frequency response.

Nonlinear distortion can lead to a more severe degradation of the sound. Extra frequency components known as harmonics and intermodulation distortions that may not be present in the original sound could appear. These "extra sounds" can alter the original sound in a way that it is perceived as harsh and unnatural. As is well known in the art, sound is produced by the vibration of a loudspeaker's diaphragm or horn. Generally, nonlinear distortions are higher for larger excursions of the loudspeaker's diaphragm, which occur at lower frequencies and also at resonant frequencies of the loudspeaker.

To compensate for the linear and nonlinear distortions in the electro-acoustic conversion, the signal, referred to herein as d(n), is passed through a predistortion filter (also called precompensator, linearizer or equalizer) placed between the audio signal source and the loudspeaker. This arrangement is shown in FIG. 1. Referring to FIG. 1, the moving coil of loudspeaker 103 is driven by a prefiltered signal $d_{pre}(n)$. The prefiltered signal $d_{pre}(n)$ is generated by predistortion filter 102. The filtering performed by predistortion filter 102 is designed to be opposite to the distortion of loudspeaker 103, so that the actual displacement of the moving coil accurately matches the ideal motion prescribed by the original signal d(n) from signal source 101.

Volterra expansions have been used in the art to model the linear (H1) and nonlinear (H2, H3, . . . ) components of loudspeaker's response. FIG. 2 illustrates the second order Volterra model. These components are estimated from a loudspeaker's input and output measurements. Applying sinusoidal signals and measuring the extent to which harmonics or combination tones are generated at the output of the nonlinear system have traditionally been used to measure nonlinear distortion. In contrast to the sinusoidal input approach, a random noise is often used to analyze a loudspeaker's nonlinearities. The random input approach approximates a frequency-multiplexed input such as music or speech and does not require repeating the same experiments by changing the frequency of the input tones. The random input approach usually involves modeling a nonlinear system with a Volterra series representation. A least-squares technique such as the least mean squares (LMS) or recursive least squares (RLS) is then used to compute the parameters of the linear (H1) and the nonlinear (H2, H3, . . . ) components.

In general, the input-output relationship of the loudspeaker in the time-domain is given by a p-th order Volterra expansion as:

$$y(n) = \sum_{k=0}^{p} H_k[x(n)] \qquad (1)$$

where, $H_k = h_k(m_1, m_2, m_3, \ldots m_k)$ is the k-th order Volterra kernel and $H_k[x(n)]$ is given as:

$$H_k[x(n)] = \sum_{m_1=0}^{M_k}\sum_{m_2=0}^{M_k}\sum_{m_3=0}^{M_k}\ldots\sum_{m_k=0}^{M_k} h_k(m_1, m_2, m_3, \ldots m_k) \qquad (2)$$
$$x(n-m_1) \times (n-m_2)x(n-m_3)\ldots x(n-m_k)$$

It is generally assumed that loudspeakers can be sufficiently modeled by a second or third order (quadratic) Volterra model. The second order model is a special case of equation (1) and is given as:

$$y(n) = h_0 + \sum_{i=0}^{M_1} h_1(i)x(n-i) + \qquad (3)$$
$$\sum_{m_1=0}^{M_2}\sum_{m_2=0}^{M_2} h_2(m_1, m_2)x(n-m_1)x(n-m_2)$$

The first term is a constant and is generally assumed to be zero, the second term is the linear response (H1), and the third term is the quadratic nonlinear response (H2).

The loudspeaker model is often used to find a nonlinear predistortion filter that may be placed between the audio signal source and the loudspeaker. Referring back to FIG. 1, ideally, predistortion filter 102 produces a predistorted signal $d_{pre}(n)$ which, when fed to loudspeaker 103, causes the output acoustic signal output by loudspeaker 103 to be an exact replica of the original audio signal d(n). In this case, there has been complete compensation for both the linear and the nonlinear distortions.

Exact compensation of nonlinear distortions requires a predistortion filter that is the exact inverse of the loudspeaker model. Finding the exact inverse of a nonlinear system is not straightforward and poses a challenge in equalizing any nonlinear system including nonlinear loudspeakers. A number of approximate solutions have been tried in the art. These schemes use the Volterra model of the loudspeaker to find a predistortion filter that is an approximation to the loudspeaker's nonlinear inverse. Typically, the approximate inverse has only a linear component and a second order or quadratic component. FIG. 3 illustrates a model in which G1 and G2 are the linear and quadratic parts of the Volterra inverse.

The linear part is typically selected to completely compensate for the loudspeaker's linear distortion ($G1=H_1^{-1}$) as described above. The second order or quadratic component of the predistortion filter is selected to completely compensate for the quadratic distortion of the loudspeaker ($G2=H_1^{-1}H2H_1^{-1}$). As a by-product of this compensation scheme, extraneous third, fourth, and higher order nonlinearities are introduced. Higher order (the so-called p-th order) predistortion filters are used to construct a better approximation to the nonlinear inverse. In the case of such filters, higher order nonlinearities are introduced at the loudspeaker output.

The p-th order Volterra inverse converges to the real inverse only if certain conditions are met. For small signal levels, Volterra preinverse improves the perceived sound quality from loudspeakers. For high playback levels (e.g., a sound level required in a multimedia application when the loudspeaker is at about an arm's length from the ear such as in a videophone or teleconferencing with speaker phone as opposed to a low playback level where there is a comfortable sound level when the loudspeaker is close to the ear as in voice communication with cell phones), the p-th order Volterra inverse may not converge to the exact nonlinear inverse and as a result the extra distortions introduced by the predistortion filter may be worse than the original uncompensated loudspeaker distortions. The structure of the p-th order Volterra inverse is such that compensation may be made for linear distortions at a high cost for nonlinear distortions. For large input levels, the third, fourth and higher order distortions become larger than the compensated distortions, thereby rendering the precompensation scheme useless. As a result, the sound quality of the Volterra precompensated loudspeaker may be lower than the uncompensated case. Thus, the nature of the Volterra model of the loudspeaker is such that it leads to an unstable exact nonlinear inverse and therefore results in a pseudo-exact inverse.

The loudspeaker model can be approximated over short time frames using a memoryless Wiener or Hammerstein model. The advantage of this model is that it leads to a guaranteed stable inverse. The disadvantage of this model is that it does not take into account memories of linear and nonlinear kernels and leads to a poor model of the loudspeaker.

Therefore, a method is needed to overcome the limitations of the present schemes at high playback levels.

SUMMARY OF THE INVENTION

A method and apparatus for adaptive precompensation is disclosed. In one embodiment, the method comprises modifying operation of a predistortion filter in response to previous predistorted values and an original input signal, determining a precompensation error between the original input samples and the predicted loudspeaker output, and reducing the precompensation error by using the exact inverse of a loudspeaker model that is a cascaded arrangement of at least one linear system with a non-linear system.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1:
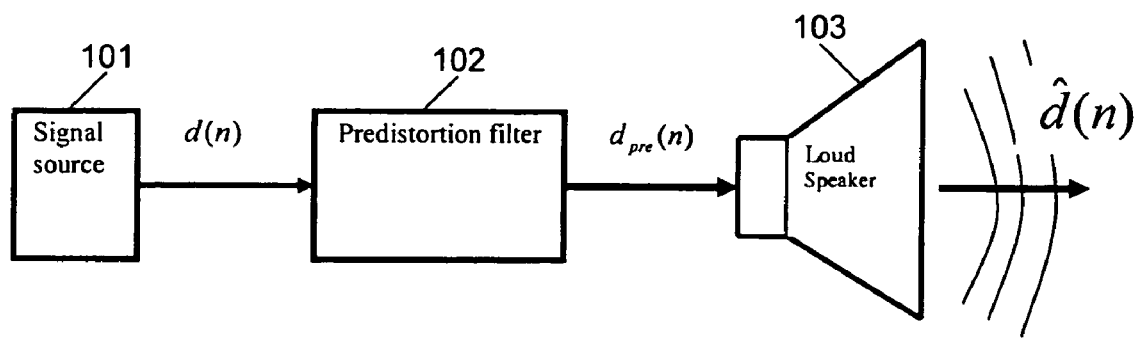
FIG. 1 illustrates a predistortion filter for loudspeaker equalization.

A novel method and an apparatus called the Volterra-Wiener-Hammerstein system (MVWH) for modeling and equalization of loudspeakers is disclosed. The model provides an accurate characterization of a loudspeaker and its use and also leads to a better equalization for loudspeakers. The model combines the desirable memory features of the Volterra model with the desirable invertibility properties of the Wiener and Hammerstein models to provide a more accurate characterization of a loudspeaker's performance to compensate for its distortions. This results in a stable exact inverse for compensating for a loudspeaker's nonlinear distortion. The techniques disclosed herein result in higher quality sound from loudspeakers, particularly at high playback levels.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes such as a VLSI chip, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

Overview

A method and apparatus for precompensation of linear and nonlinear distortions of a loudspeaker in order to reduce loudspeaker distortions are described. In one embodiment, the precompensation provides compensation for a loudspeaker's linear and nonlinear distortions using an improved model of the loudspeaker that lends itself to having an exact nonlinear inverse.

The precompensation is performed using a predistortion filter, which acts as a precompensator. In one embodiment, the predistortion filter transforms the input signal using an exact inverse of the estimated loudspeaker transfer function and reproduces near perfect reproduction of the input sound. In one embodiment, a model of the electroacoustic characteristics of the loudspeaker is used to derive a transfer function of the loudspeaker. The precompensator then performs an inverse of this transfer function. Accordingly, the output of the loudspeaker more closely resembles the original input signal. The difference between the input and the predicted loudspeaker output provides a feedback signal that is used to adjust the parameters of the precompensator so that the error is minimized or substantially reduced.

In one embodiment, the predistortion filter performs predistortion using a modified Volterra-Wiener-Hammerstein model to characterize a loudspeaker's response and to compensate for its linear and nonlinear distortions. Techniques herein combine the desirable memory features of the Volterra model with the desirable invertibility properties of the Wiener and Hammerstein models to provide accurate characterization of a loudspeaker's performance and an effective method to compensate for its distortions. In one embodiment, a stable exact inverse is used for compensating for a loudspeaker's nonlinear distortion. The techniques described herein adaptively adjust the parameters of the predistortion filter such that the difference between the input audio signal and the precompensated output of the loudspeaker is minimized or substantially reduced.

In one embodiment, performing adaptive precompensation comprises modifying the operation of a predistortion filter in response to the previous predistorted values and the original input signal, determining a precompensation error between the original input samples and the loudspeaker output, and substantially reducing the precompensation error by computing the exact inverse of a loudspeaker's model. Substantial reduction in the precompensation error is achieved by computing the coefficients of a polynomial representing the exact inverse, computing the predistorted signal by finding a real root of this polynomial, scaling and storing the root for the next coefficient computation and rescaling the predistorted signal before feeding it into the loudspeaker.

Application of the methods disclosed herein results in higher quality sound from loudspeakers especially at high playback levels. The resulting improvement in quality makes these techniques suitable for inclusion in applications where high quality sound from loudspeakers at high playback levels is desired. Such applications and devices include, but are not limited to, cellular phones, teleconferencing, videophones, videoconferencing, personal digital assistants, WiFi, systems, laptop computers, etc.

Figure 4:
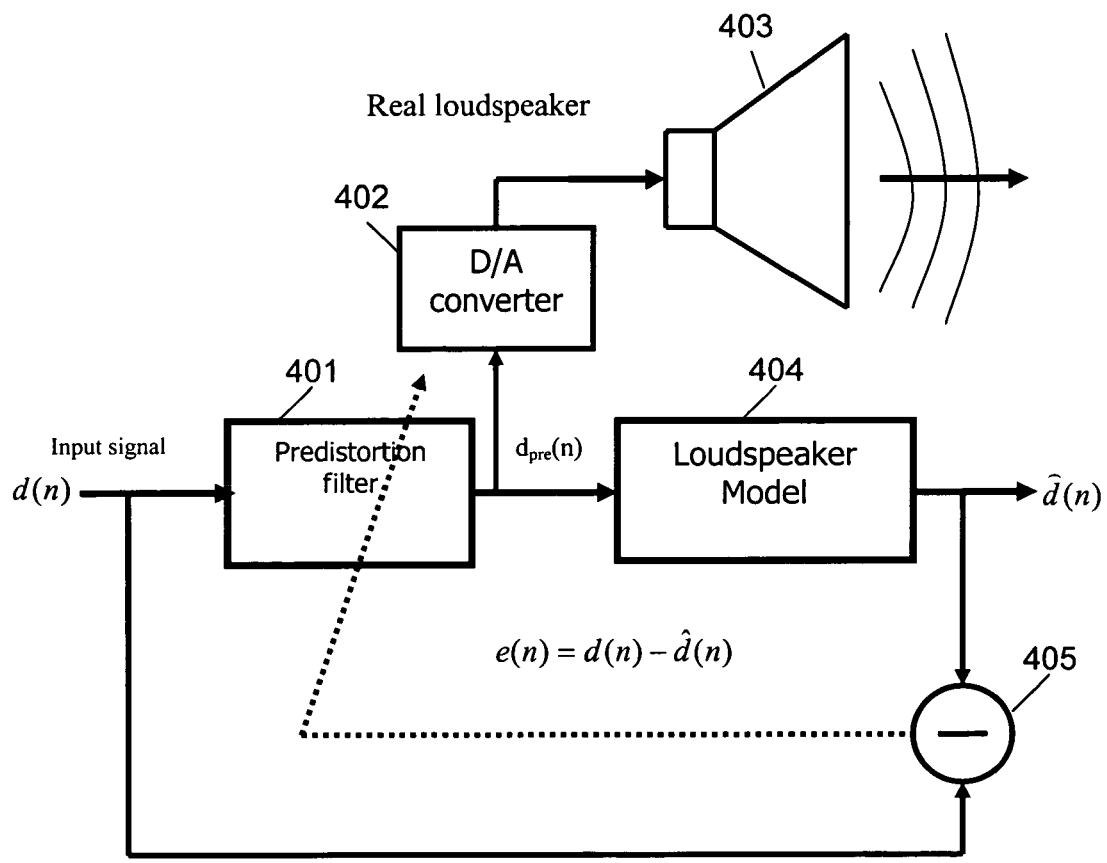
FIG. 4 is a block diagram of one embodiment of an audio system having a predistortion filter based on the exact inverse with feedback for loudspeaker linearization.

FIG. 4 is a block diagram of one embodiment of an audio system. Referring to FIG. 4, input signal d(n) is fed into a time-varying predistortion filter 401. The output of predistortion filter 401 is input into a mathematical model 404 of loudspeaker 403 and also to digital-to-analog (D/A) converter 402 that drives loudspeaker 403. The mathematical model 404 of loudspeaker 403 predicts the next output of loudspeaker 403, referred to herein as $\hat{d}(n)$. In one embodiment, the mathematical model 404 of the loudspeaker in general is a p-th order modified Volterra-Wiener-Hammerstein model (MVWH) as described below. The predicted output from loudspeaker model 404 is used to derive a precompensation error signal (e(n)=d(n)−d̂(n)) that is the difference between the ideal output and the predicted loudspeaker output, as determined by comparator (e.g., subtractor) 405. Thus, predistortion filter 401 acts as a precompensator. In one embodiment, the parameters of the precompensator are adjusted in such a way that the precompensation error e(n) is minimized or substantially reduced.

The Modified Volterra-Wiener-Hammerstein (MVWH) Model

Figure 2:
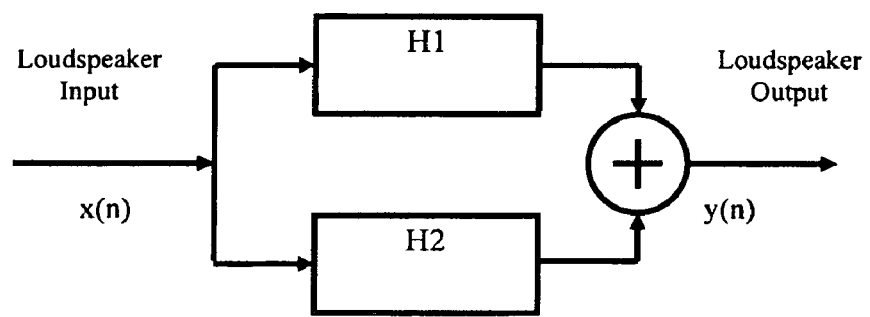
FIG. 2 illustrates a 2nd order Volterra model of the loudspeaker.
Figure 3:
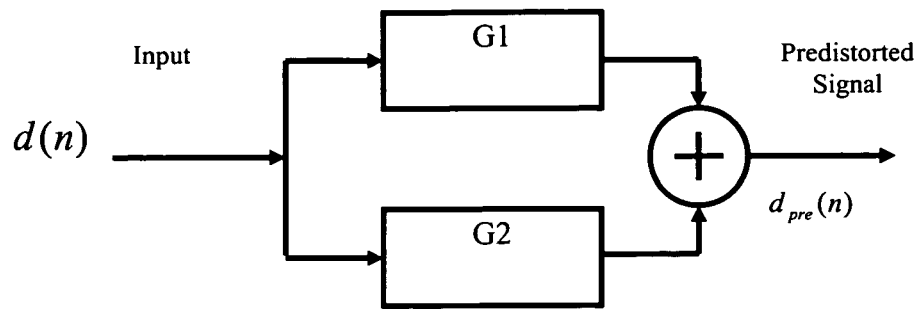
FIG. 3 illustrates a 2nd order predistortion filter based on the $2^{nd}$ order Volterra inverse of the loudspeaker model.
Figure 5:
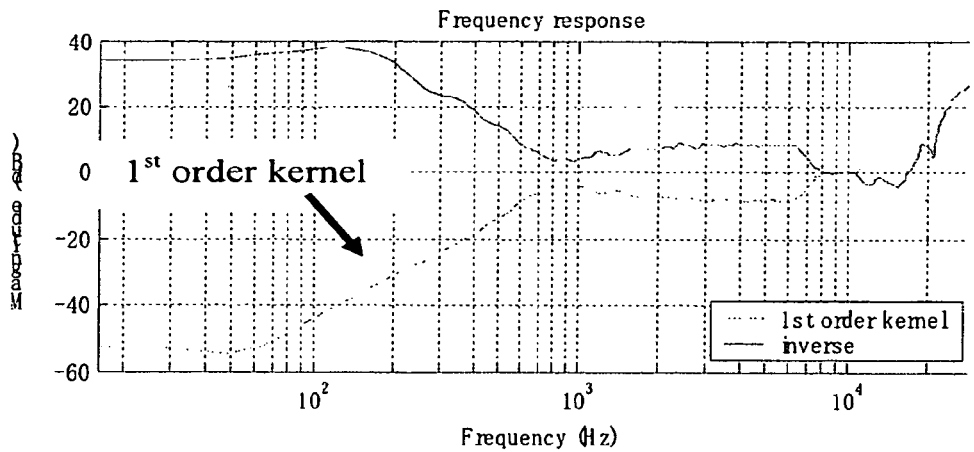
FIG. 5 illustrates a linear transfer function and its inverse.
Figure 6:
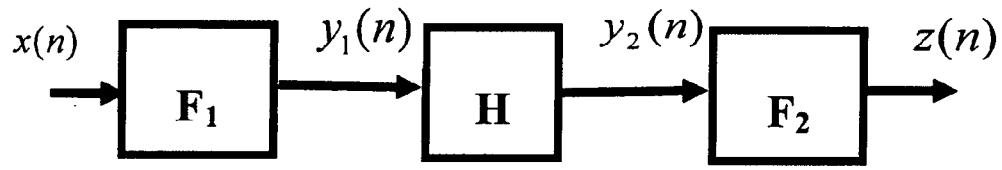
FIG. 6 illustrates an embodiment of the modified Volterra-Wiener-Hammerstein model (MVWH)

As seen in FIG. 2, the Volterra model consists of a parallel combination of linear and nonlinear subsystems. FIG. 5 illustrates the linear transfer function $H_1$ which shows that low frequencies cannot be reproduced by the loudspeaker. A shortcoming of the Volterra model is that the model's response to a pure tone has a frequency-dependent DC component whereas a real loudspeaker's output cannot have a DC component. The major shortcoming of the Volterra model is that it does not lend itself to having an exact nonlinear inverse. In one embodiment, the loudspeaker model used in the precompensation scheme of the present invention is a modified Volterra-Wiener Hammerstein (MVWH) model. Use of such a model overcomes the problems of the Volterra model described above. FIG. 6 illustrates an embodiment of the MVWH model. Referring to FIG. 6, the input signal x(n) first passes through a linear filter $F_1$ producing the output $y_1(n)=F_1[x(n)]$, which drives the modified Volterra model H producing the output $y_2(n)=H[y_1(n)]$, which feeds another linear system $F_2$ producing the model output $z(n)=F_2[y_2(n)]$. Thus, the modified Volterra-Wiener-Hammerstein (MVWH) model is a cascade combination of two linear filters ($F_1$ and $F_2$) and a Volterra system (H). The Volterra system provides a p-th order nonlinearity with memory which is in contrast to a simple memoryless Wiener or Hammerstein nonlinearity.

In this model the prefilter $F_1$ can be a lowpass filter representing the lowpass behavior of the loudspeaker's coil RL circuit. The postfilter $F_2$ can be a highpass filter representing the highpass behavior of the loudspeaker's diaphragm. These are just two possibilities among many possible combinations of $F_1$, $F_2$ and H. The input-output relationship of the MVWH model is given as ([.] is operator notation):

$$z(n)=F_2[H[F_1[d(n)]]]$$

where the M-th order linear filter $F_1$ is given as:

$$y_1(n) = \sum_{i=0}^{M} f_1(i)x(n-i)$$

where M is the memory of the linear filter and $\{f_1(i), f_2(i), i=0, 1, \ldots M\}$ are the coefficients of the linear filters. A special case in which $F_1=1$ corresponds to the Volterra-Hammerstein model and the special case $F_2=1$ corresponds to the Volterra-Wiener model.

Numerous ways exist to compute parameters of the linear filters and the Volterra model. Two ways to compute the parameters of the linear filters and the Volterra model are given below. The first method is a process that is fast but provides an approximate solution. Referring to FIG. 6, first, a Volterra model is fit to the loudspeaker and the Volterra kernels $\{H_k, k=1, 2, 3 \ldots\}$ are found using the input x(n) and output d(n). Then, the filters $F_1$ and $F_2$ are found such that the cascade of the two filters is the same as $H_1$ (i.e. $F_1*F_2=H_1$). As a special case, it can be assumed that the two linear filters are identical (i.e. $F_1=F_2$). Given filters $F_1$ and $F_2$, the input $y_1(n)$ and output $y_2(n)$ of the Volterra model in FIG. 6 are computed and a new Volterra filter with kernels $\{H'_k, k=1, 2, 3 \ldots\}$ that matches the loudspeaker output d(n) is found. The second method uses the gradient descent algorithm to jointly optimize the parameters of the linear filters and the modified Volterra model.

Figure 7:
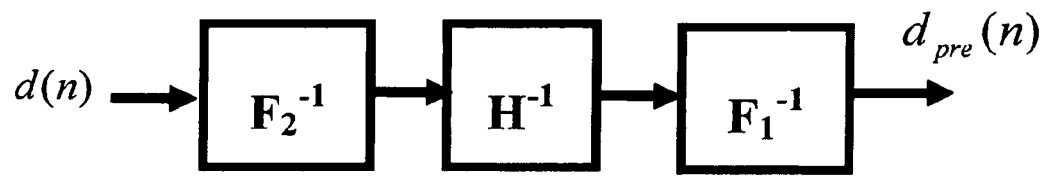
FIG. 7 illustrates an embodiment of the inverse of the MVWH model.

FIG. 7 shows an embodiment of the inverse of the MVWH model. Referring to FIG. 7, $F_1^{-1}$ and $F_2^{-1}$ are the inverses of the linear filters in FIG. 6 and $H^{-1}$ is the exact inverse of the Volterra part of the MVWH model. Exact precompensation based on the Volterra model results in an unstable inverse. A key advantage of the MVWH model is that it is a cascade of linear filters and a modified Volterra model. The effect of this cascade operation is that the linear filter part from the loudspeaker model is explicitly extricated so that the remaining modified Volterra model lends itself to having an exact nonlinear inverse.

Figure 8:
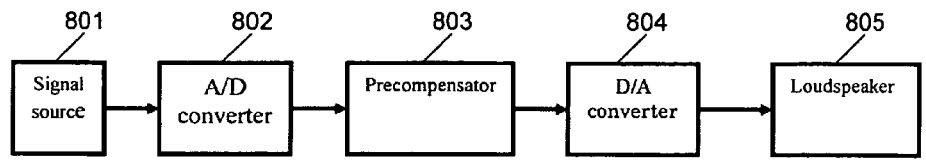
FIG. 8 is a block diagram of a loudspeaker system with an analog signal source.

FIG. 8 is a block diagram of one embodiment of a loudspeaker system where the signal source is an analog source. Referring to FIG. 8, signal source 801 produces an analog signal. The analog signal is converted to a digital signal using an analog-to-digital (A/D) converter 802. The digital output of A/D converter 802 feeds digital precompensator 803. Precompensator 803 produces a predistorted signal that when passed through loudspeaker 805 compensates for the linear and nonlinear distortions. Precompensator 803 uses a cascade of one or more linear filters with a modified Volterra model. In one embodiment, precompensator 803 uses the MVWM model. The digital output of precompensator 803 is fed into a digital-to-analog (D/A) converter 804, which generates an analog output that drives loudspeaker 805.

Figure 9:
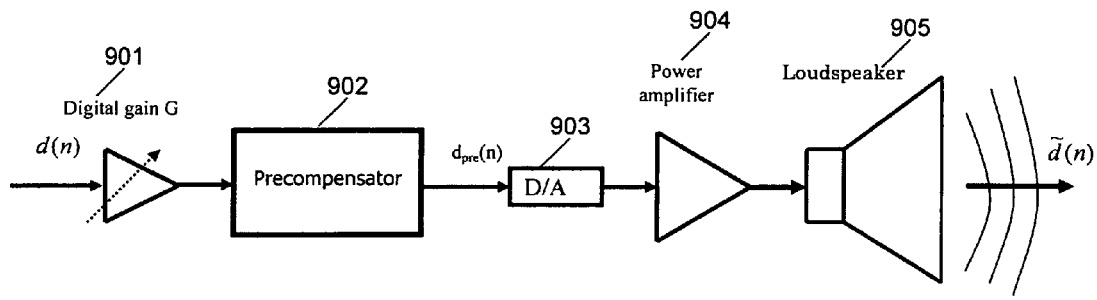
FIG. 9 illustrates an alternate embodiment of a loudspeaker system where the sound level of the loudspeaker is controlled by a digital gain element or device located before the precompensator.

FIG. 9 shows an alternate embodiment of a loudspeaker system in which the sound level of the loudspeaker is controlled by a digital gain before the precompensator. A digitized signal d(n) is fed into a variable digital gain module 901. The function of variable gain module 901 is to control the signal level into digital precompensator 902. Precompensator 902 performs the precompensation described above. The output of precompensator 902, $d_{pre}(n)$, is fed into a digital-to-analog (D/A) converter 903. The analog signal from D/A converter 903 is input into a fixed gain power amplifier 904 that drives loudspeaker 905.

Figure 10:
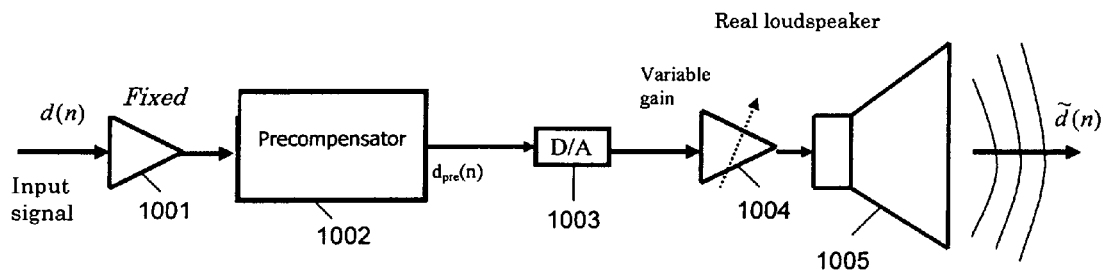
FIG. 10 illustrates another alternate embodiment of a loudspeaker system in which the sound level from the loudspeaker is controlled by a variable analog gain of a power amplifier located before the loudspeaker.

FIG. 10 shows an alternate embodiment of a loudspeaker system in which the sound level from the loudspeaker is controlled by the variable analog gain of a power amplifier before the loudspeaker. Referring to FIG. 10, the digital input signal d(n) is altered by a fixed gain device 1001 and then input into precompensator 1002. Precompensator 1002 performs precompensation using the predistortion filter and cascaded arrangement described above. The output of precompensator 1002, $d_{pre}(n)$ is fed into a digital-to-analog (D/A) converter 1003. The analog signal from D/A converter 1003 is input into a variable gain power amplifier 1004 that drives loudspeaker 1005. Variable gain amplifier 1004 controls the sound level of loudspeaker 1005.

Figure 11:
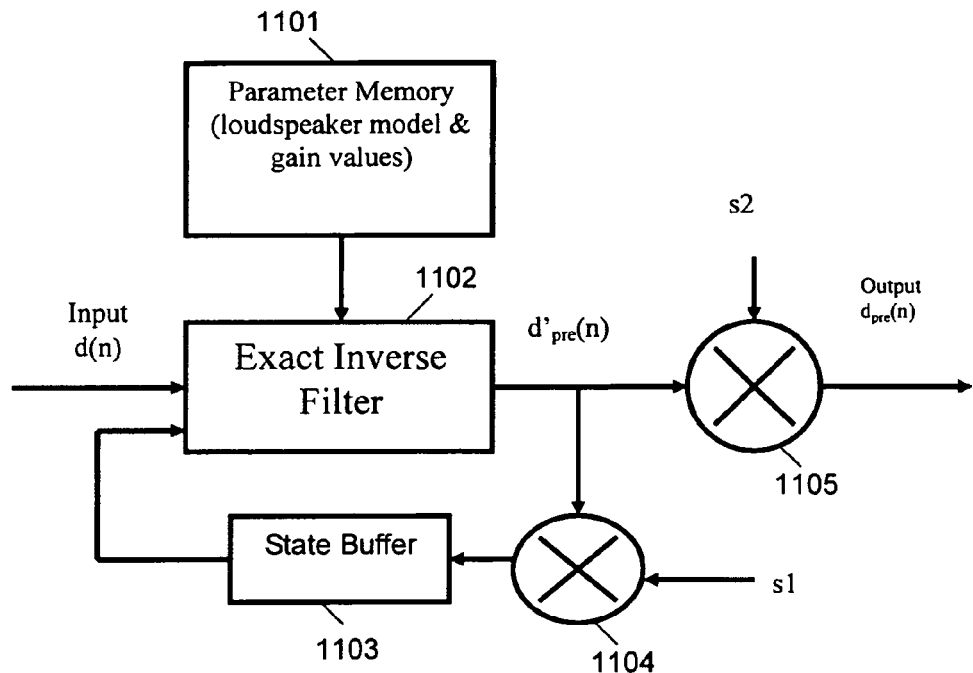
FIG. 11 illustrates one embodiment of the nonlinear inverse portion of the MVWH model.

FIG. 11 shows one embodiment of the Volterra inverse part of the MVWH model consisting of five components.

Memory module 1101 stores the parameters of the loudspeaker model and also various gain parameters. In one embodiment, these parameters represent a second-order Volterra model. Parameters of the linear and nonlinear parts $H1=[h_1(0), h_1(1), \ldots h_1(M_1)]$ and $H2=\{h_2(i, j), i, j=0, 1, \ldots M_2\}$ are stored in memory 1101. For higher-order Volterra models, the parameters of the higher order kernels are also stored in memory 1101. The digital signal d(n) is input into exact inverse module 1102. The function of exact inverse module 1102 is to perform a nonlinear inverse operation. Exact inverse module 1102 takes the input signal d(n) and scaled past values of its output {d'$_{pre}$(n−1),d'$_{pre}$(n−2), ... } from a state buffer 1103 and produces the current value of the output d'$_{pre}$(n). Past values of the predistorted signal are first scaled by a factor s1 using a gain module 1104 and stored in state buffer 1103 as shown in FIG. 11.

The final output of the Volterra inverse is a scaled version of the output from the exact inverse module. This scaling is performed by a gain module 1105 that has a gain of s2. In one embodiment, gains s1 and s2 are stored in parameter memory 1101. Gains s1 and s2 could be fixed or variable. Alternate embodiments may use unity gain for s1 (s1=1) and store a related set of parameters such as properly scaled version of the model parameters in the parameter memory. Values of s1 and s2 depend on the loudspeaker. For typical loudspeakers deployed in cellular phones, s1 may vary from 0.005 to 1 and s2 may be taken to be the inverse of s1.

Figure 12:
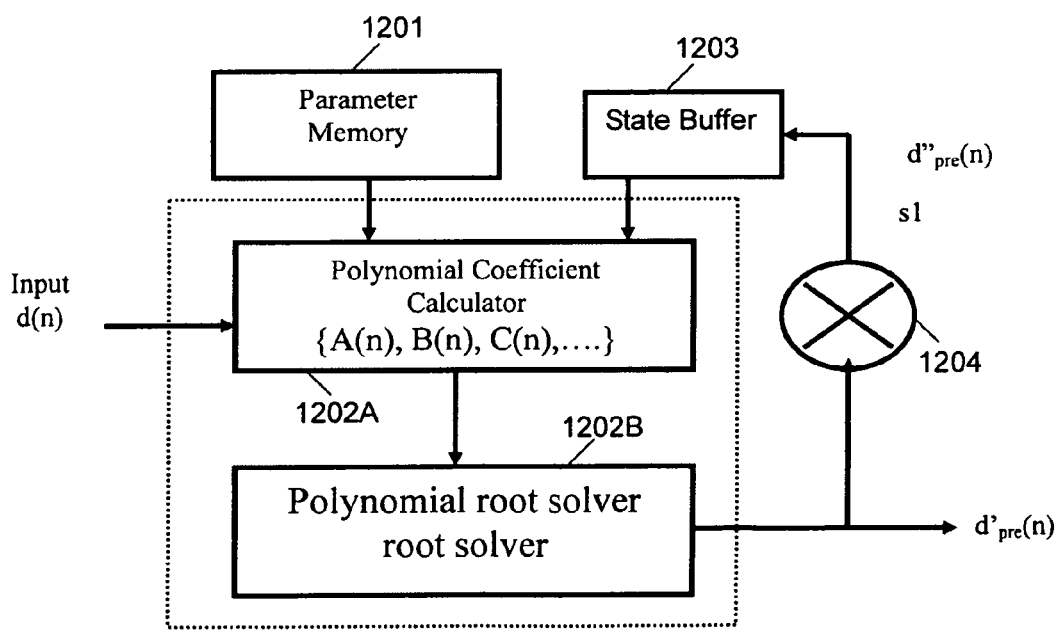
FIG. 12 illustrates one embodiment of the exact inverse of the Volterra model consisting of a polynomial coefficient calculator and a polynomial root solver.

FIG. 12 is a block diagram of one embodiment of the exact inverse of the Volterra portion of the MVWH model consisting of a polynomial coefficient calculator and a polynomial root solver. Referring to FIG. 12, polynomial coefficient calculator module 1202A computes the (p+1) coefficients of a p-th order polynomial using the loudspeaker model parameters from parameter memory 1201, the past values of the predistorted signal from state buffer 1203 and the input signal d(n). A polynomial root solver 1202B uses the computed coefficients and computes a real root of this polynomial. The computed root constitutes the output d'$_{pre}$(n) of the exact inverse.

The output d'$_{pre}$(n) is scaled by gain module 1204 using a gain of s1. The scaled version is stored in state buffer 1203 for subsequent calculations.

Figure 13:
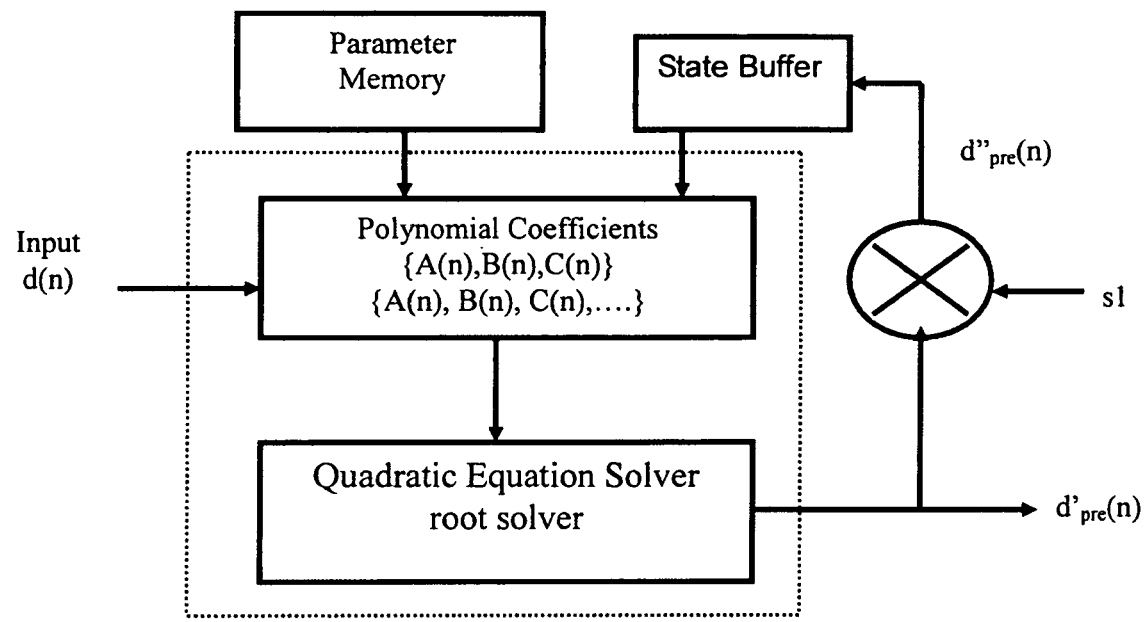
FIG. 13 illustrates an alternate embodiment of the exact inverse where the polynomial representing the exact inverse is a second-degree polynomial.

FIG. 13 shows an alternate embodiment of the exact inverse of the Volterra potion of the MVWH model where the polynomial representing the exact inverse is a second-degree polynomial having three generally time-dependent coefficients A(n), B(n) and C(n). The quadratic equation in this case is given as:

$$A(n)d'^2_{pre}(n)+B(n)d'_{pre}(n)+C(n)=0 \quad (1)$$

Roots of this equation give the output of the exact inverse d'$_{pre}$(n). The polynomial root solver in this embodiment is a quadratic equation solver.

Referring to FIG. 13, one method to compute these coefficients is given by the following equations:

$$A(n) = h_2(0, 0) \quad (2a)$$

$$B(n) = h_1(0) + \sum_{j=1}^{M_2} h_2(0, j)d''_{pre}(n-j) \quad (2b)$$

$$C(n) = -d(n) + \sum_{k=1}^{M_1} h_1(k)d''_{pre}(n-k) + \sum_{i=1}^{M_2}\sum_{j=i}^{M_2} h_2(i,j)d''_{pre}(n-i)d''_{pre}(n-j) \quad (2c)$$

As shown here, the coefficients depend on the parameters of the loudspeaker model {H1, H2}, the past scaled values of the predistortion signal d''$_{pre}$(n) (the states) and the input signal d(n).

As is evident from equations (2a), (2b) and (2c), the coefficients of the quadratic equation are not constant; they depend on the past scaled values of the predistorted signal d''$_{pre}$(n−i) as well as the parameters of the loudspeaker model.

As illustrated by these equations, the feedback in FIG. 13 adjusts the parameters of the exact predistortion filter on a sample-by-sample basis. Thus, for each sample of the input signal, a different quadratic equation is solved. Therefore, the exact inverse is not fixed; its parameters change with time.

In one embodiment the roots are given by the following equation:

$$d'_{pre}(n) = \frac{-B(n) \pm \sqrt{B^2(n) - 4A(n)C(n)}}{2A(n)}$$

As shown here, in general there are multiple roots. For a p-th order polynomial, there are in general p roots and for a quadratic equation there are in general two roots. All of these roots are possible candidates for use in the solution, however; only one root is selected for subsequent processing. Various criteria can be employed to select a candidate solution. In one embodiment, the selected root must be real. In the case that no real root exists, an alternate real value for d'$_{pre}$(n) can be selected so that the precompensation error e(n) is minimized. For a p-th order polynomial, if p is odd, at least one real root is guaranteed to exist. If p is even and no real root exists, a (p−1)-th order polynomial can be derived from the p-th order polynomial by differentiating relative to d'$_{pre}$(n). The derived polynomial has order (p−1) which will be odd and is guaranteed to have a real root. The real root of the (p−1)-th order polynomial minimizes the precompensation error. For the case of a quadratic polynomial, if a real root does not exist, the alternate real solution that minimizes the precompensation error is given by:

$$d'_{pre}(n) = \frac{-B(n)}{2A(n)}$$

Different valid solutions (roots) may result in different overall performance for the precompensator. For example, some roots may produce a predistorted signal that has a bias value. Such properties may or may not be desirable for certain applications. Hence, depending on the method of selecting a root from a plurality of roots, a number of different implementations may result. In one embodiment, the real root with smallest absolute value is used.

Figure 14:
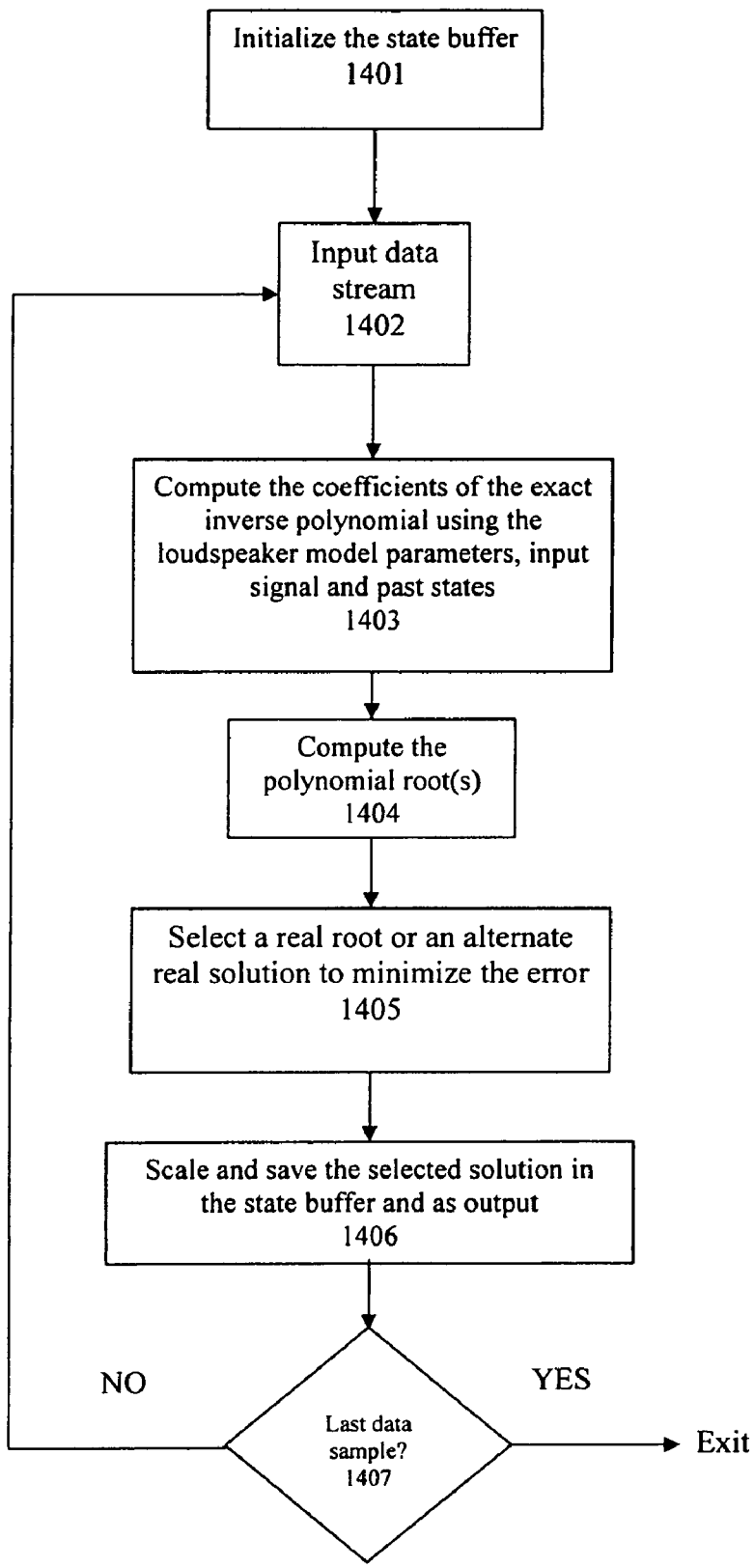
FIG. 14 is a flow diagram of one embodiment of a precompensation process preformed by a precompensator.

FIG. 14 is a flow diagram of one embodiment of a precompensation process. The process is performed by processing logic that may comprise hardware (circuitry, dedicated logic, etc.), software (such as is run on a general purpose computer system or a dedicated machine), or a combination of both. In one embodiment, the processing logic is part of the precompensator.

Referring to FIG. 14, processing logic first initializes the state buffer (processing block 1401). After initialization, processing logic receives an input data stream (processing block 1402). Then, processing logic computes coefficients of the exact inverse polynomial (e.g., according to equations (2a), (2b) and (2c)) using loudspeaker model parameters, past states of the predistortion filter, and the input signal (processing block 1403).

After computing the coefficients, processing logic computes one or more roots of the exact inverse polynomial (processing block 1404) and selects a real root of this polynomial or some alternate real solution that minimizes (or reduces) the precompensation error (processing logic 1405). Processing logic then scales the selected solution and stores the scaled version in the state buffer for the next root computation (processing block 1406). Thus, the output of the root solver scaled by another factor (s2) is output as the precompensator output.

Thereafter, processing logic tests whether the sample being processed is the last sample (processing block 1407). If the input data is not exhausted (i.e., the sample being processed is not the last sample), processing logic transitions to processing block 1402, where it reads the next data sample and the computation of the polynomial coefficients, computation and selection of the roots and storage of the past states are repeated. If so, the process ends.

An advantage of one embodiment of the present invention is that it provides better compensation for loudspeaker distortions resulting in higher quality sound from the loudspeaker.

Components and Interface

Figure 15:
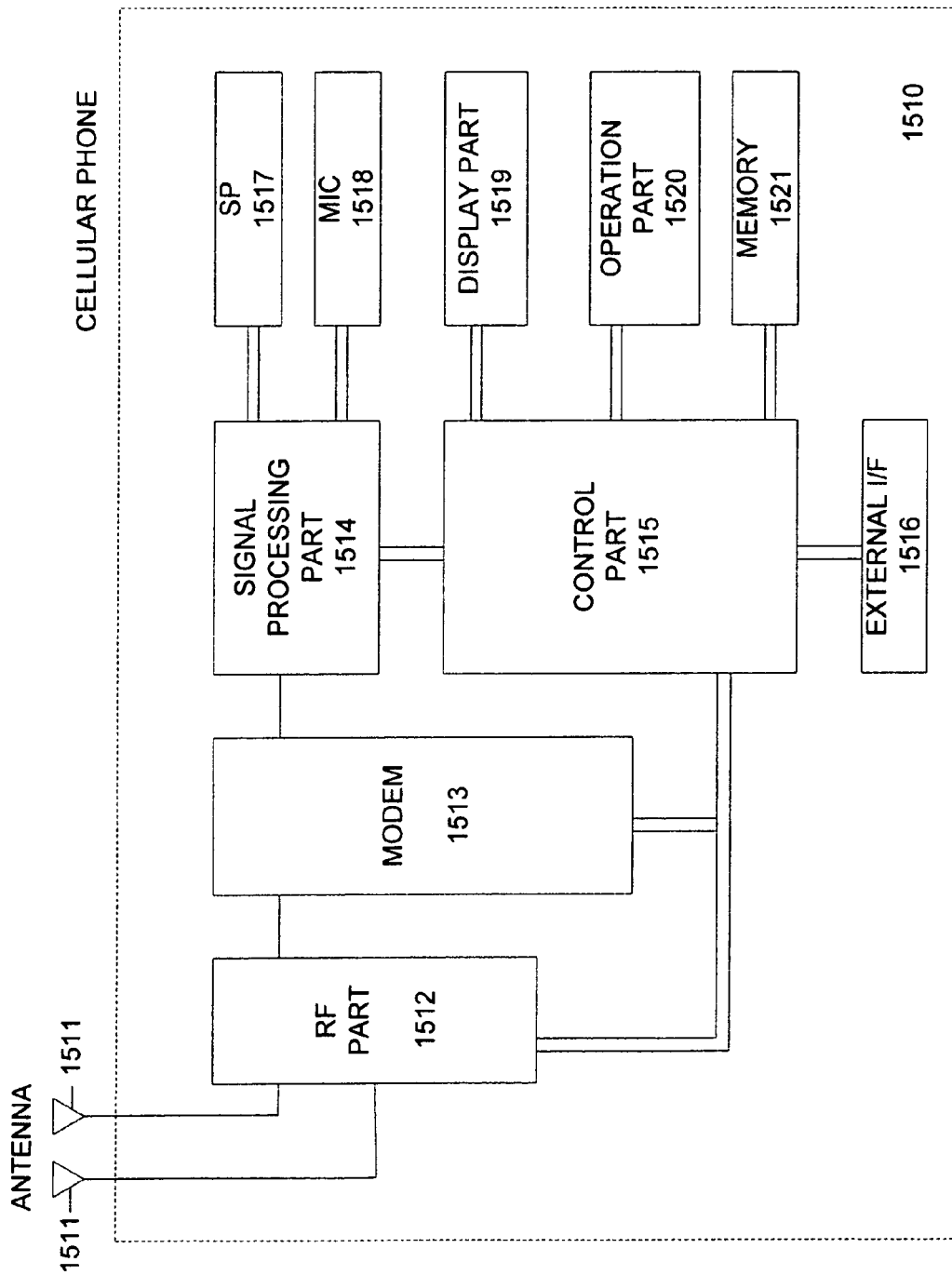
FIG. 15 is a block diagram of one embodiment of a cellular phone.

A number of components are included in devices and/or systems that include the techniques described herein. For example, a central processing unit (CPU) or a digital signal processor (DSP) for computing the coefficients and roots of the inverse polynomial. A memory for storing the loudspeaker model, the precompensator parameters and portions of the input signal is part of such a device and/or system. Furthermore, analog and digital gain elements may be included in the audio system. These may include digital multipliers and analog amplifiers. One such device is a cellular phone. FIG. 15 is a block diagram of one embodiment of a cellular phone.

Referring to FIG. 15, the cellular phone 1510 includes an antenna 1511, a radio-frequency transceiver (an RF unit) 1512, a modem 1513, a signal processing unit 1514, a control unit 1515, an external interface unit (external I/F) 1516, a speaker (SP) 1517, a microphone (MIC) 1518, a display unit 1519, an operation unit 1520 and a memory 1521.

In one embodiment, the external terminal 1516 includes an external interface (external I/F), a CPU (Central Processing Unit), a display unit, a keyboard, a memory, a hard disk and a CD-ROM drive.

The CPU in cooperation with the memories of cellular phone 1510 (e.g., memory 1521, memory, and hard disk of the external I/F 1516) performs the operations described above.

An Exemplary Computer System

Figure 16:
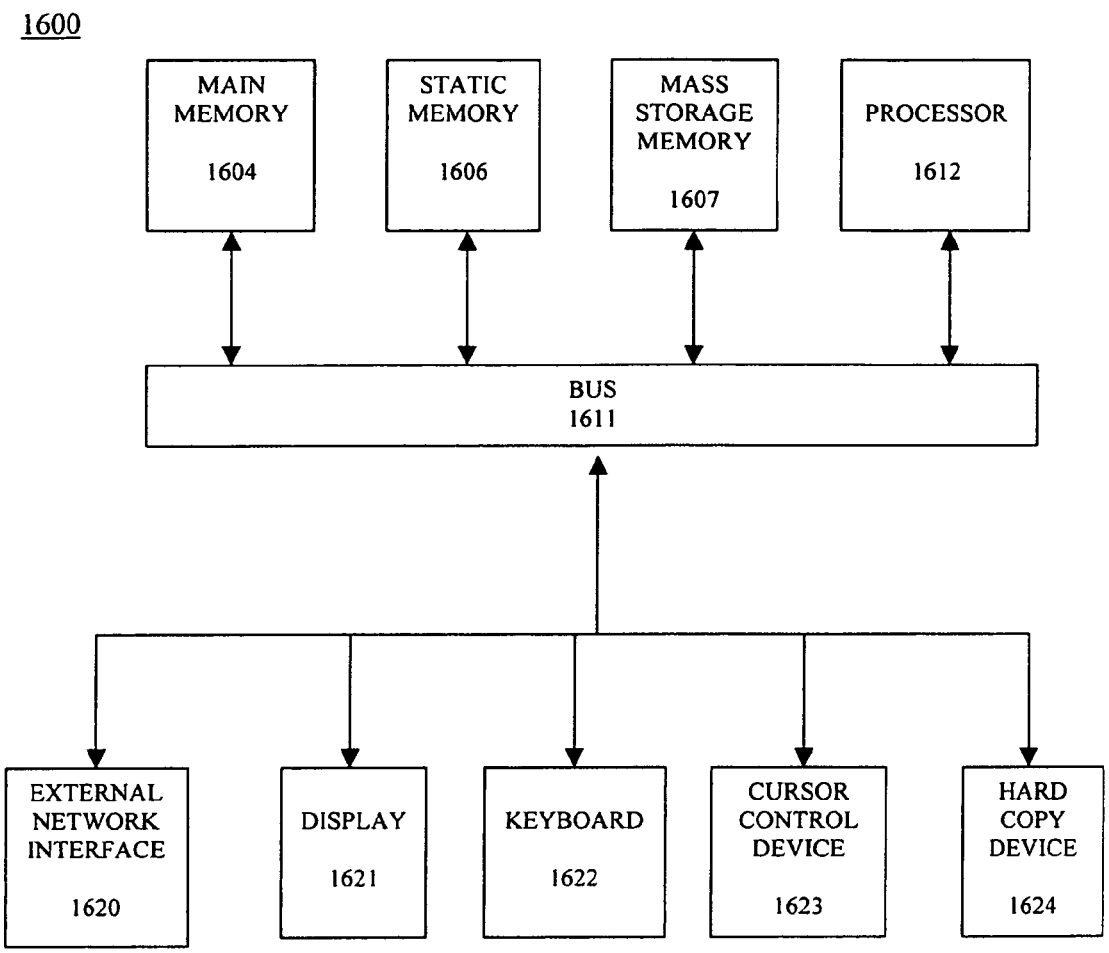
FIG. 16 is a block diagram of an exemplary computer system that may perform one or more of the operations described herein.

FIG. 16 is a block diagram of an exemplary computer system that may perform one or more of the operations described herein. Referring to FIG. 16, computer system 1600 may comprise an exemplary client or server computer system. Computer system 1600 comprises a communication mechanism or bus 1611 for communicating information, and a processor 1612 (e.g., central processing unit (CPU), digital signal processor (DSP), etc.) coupled with bus 1611 for processing information. Processor 1612 may include a microprocessor, such as, but is not limited to, for example, Pentium™, PowerPC™, etc. Processor 1612 computes the coefficients and roots of the exact inverse polynomial.

System 1600 further comprises a random access memory (RAM), or other dynamic storage device 1604 (referred to as main memory) coupled to bus 1611 for storing information and instructions to be executed by processor 1612. Main memory 1604 also may be used for storing temporary variables or other intermediate information during execution of instructions by processor 1612. For example, in on embodiment, one or more memories may store the loudspeaker model, the precompensator parameters and portions of the input signal.

Computer system 1600 also comprises a read only memory (ROM) and/or other static storage device 1606 coupled to bus 1611 for storing static information and instructions for processor 1612, and a data storage device 1607, such as a magnetic disk or optical disk and its corresponding disk drive. Data storage device 1607 is coupled to bus 1611 for storing information and instructions.

Computer system 1600 may include a loudspeaker, along with analog and digital gain elements such as digital multipliers and analog amplifiers.

Computer system 1600 may further be coupled to a display device 1621, such as a cathode ray tube (CRT) or liquid crystal display (LCD), coupled to bus 1611 for displaying information to a computer user. An alphanumeric input device 1622, including alphanumeric and other keys, may also be coupled to bus 1611 for communicating information and command selections to processor 1612. An additional user input device is cursor control 1623, such as a mouse, trackball, trackpad, stylus, or cursor direction keys, coupled to bus 1611 for communicating direction information and command selections to processor 1612, and for controlling cursor movement on display 1621.

Another device that may be coupled to bus 1611 is hard copy device 1624, which may be used for marking information on a medium such as paper, film, or similar types of media. Another device that may be coupled to bus 1611 is a wired/wireless communication capability 1620 to communication to a phone or handheld palm device.

Note that any or all of the components of system 1600 and associated hardware may be used in the present invention. However, it can be appreciated that other configurations of the computer system may include some or all of the devices.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

I claim:

1. An adaptive precompensation method comprising:
    modifying operation of a predistortion filter in response to previous predistorted values and an original input signal;
    determining a precompensation error between the original input samples and a predicted loudspeaker output; and
    reducing the precompensation error by using an exact inverse of a loudspeaker model that is a cascaded arrangement of a linear system with a non-linear system, wherein the loudspeaker model comprises a p-th order modified Volterra-Wiener-Hammerstein (MVWH) model.

2. The method defined in claim 1 wherein the model comprises a cascaded arrangement of a linear system with a Volterra system.

3. The method defined in claim 1 wherein the model comprises a cascaded arrangement of a linear system, a non-linear system, and a linear system.

4. The method defined in claim 1 wherein the model comprises a cascade arrangement of:
    a first linear filter having a first output;

a Volterra model to receive the first output and produce a second output in response thereto; and a second linear filter to receive the second output and produce a third output, the third output being the output of the model.

5. The method defined in claim 4 further comprising computing parameters for the first and second filters and the Volterra model.

6. The method defined in claim 5 wherein computing parameters for the first and second filters and the Volterra model comprises:

fitting the Volterra model to the loudspeaker;

identifying Volterra kernels associated with the Volterra model; and identifying the first and second filters for which the first and second filters of the cascade arrangement is equal to a linear part of the Volterra model for each kernel.

7. The method defined in claim 5 wherein computing parameters for the first and second filters and the Volterra model comprises jointly determining parameters for the first and second filters and the Volterra model using a gradient descent algorithm.

8. The method defined in claim 1 wherein substantially reducing the precompensation error comprises:

computing coefficients of a polynomial representing the exact inverse; and computing a predistorted signal by finding a real root of the polynomial.

9. The method defined in claim 8 wherein substantially reducing the precompensation error further comprises:

scaling and storing the root for a next coefficient computation; and rescaling the predistorted signal before feeding the predistorted signal into the loudspeaker.

10. The method defined in claim 1 wherein the precompensation error represents a difference between the original input samples and the predicted loudspeaker output.

11. An apparatus comprising:

a loudspeaker;

a digital-to-analog (D/A) converter to convert a precompensated signal into an analog signal and send the analog signal to the loudspeaker; and a precompensator to generate the precompensated signal, the precompensator having a predistortion filter that uses an exact inverse of a loudspeaker model, which is a cascaded arrangement of at least one linear system with a non-linear system to characterize a response of the loudspeaker and to compensate for linear and non-linear distortions of the loudspeaker, wherein the loudspeaker model comprises a p-th order modified Volterra-Wiener-Hammerstein (MVWH) model.

12. The apparatus defined in claim 11 wherein the model comprises a cascaded arrangement of a Volterra system with a linear system.

13. The apparatus defined in claim 11 wherein the model comprises a cascaded arrangement of a linear system, a non-linear system, and a linear system.

14. The apparatus defined in claim 11 wherein the model comprises a cascade arrangement of:

a first linear filter having a first output;

a Volterra model to receive the first output and produce a second output in response thereto; and a second linear filter to receive the second output and produce a third output, the third output being the output of the model.

15. The apparatus defined in claim 11 wherein operation of the predistortion filter is modified in response to previous predistorted values and the original input signal.

16. The apparatus defined in claim 11 wherein parameters of the predistortion filter are adaptively adjusted to reduce a difference between the input audio signal and a precompensated output of the loudspeaker.

17. The apparatus defined in claim 11 wherein the inverse is a stable exact inverse.

18. The apparatus defined in claim 11 wherein the precompensator comprises an exact inverse module to perform an inverse nonlinear operation using an input signal and scaled versions of previous outputs of the precompensator.

19. The apparatus defined in claim 18 wherein the exact inverse module computes the inverse of the loudspeaker model.

20. The apparatus defined in claim 18 wherein the inverse module comprises:

a polynomial coefficient calculator to compute coefficients of a polynomial; and a polynomial root solver to generate a real root of the polynomial in response to the coefficients.

21. The apparatus defined in claim 20 wherein the polynomial coefficient calculator computes the coefficients using the samples of an input signal, parameters of the loudspeaker model, and previously predistorted samples of the input signal.

22. The apparatus defined in claim 20 wherein the inverse is given by a second order polynomial.

23. The apparatus defined in claim 20 wherein the root is a real root.

24. The apparatus defined in claim 20 wherein the polynomial root solver comprises a quadratic equation solver.

25. The apparatus defined in claim 20 wherein the polynomial root solver computes roots of the polynomial and selects a real root from among the roots.

26. The apparatus defined in claim 11 further comprising an analog-to-digital (A/D) converter to digitize an analog input signal into a digital signal, the precompensator to generate the precompensated signal in response to the digital signal.

27. The apparatus defined in claim 26 further comprising a digital gain module to control signal level of the digital signal prior to precompensation by the precompensator.

28. The apparatus defined in claim 27 wherein the digital gain module is a variable gain module, and further comprising a power amplifier coupled between the D/A converter and the loudspeaker to amplify the analog output from the D/A converter and send the amplified signal to the loudspeaker.

29. The apparatus defined in claim 27 wherein the digital gain module is a fixed gain module, and further comprising a variable gain module coupled between the D/A converter and the loudspeaker to control signal level of the analog output from the D/A converter and send the gain amplified signal to the loudspeaker.

30. The apparatus defined in claim 11 further comprising a digital-to-analog (D/A) converter to receive the output of the inverse and convert an output to an analog signal.

31. The apparatus defined in claim 11 further comprising a power amplifier coupled to receive the analog signal and drive the loudspeaker in response thereto.

* * * * *